(12) United States Patent
Lee et al.

(10) Patent No.: US 7,999,257 B2
(45) Date of Patent: Aug. 16, 2011

(54) PROCESS FOR ELIMINATING DELAMINATION BETWEEN AMORPHOUS SILICON LAYERS

(75) Inventors: Jiou-Kang Lee, Hsin-Chu (TW); Chun-Ren "Sean" Cheng, Hsin-Chu (TW); Shang-Ying Tsai, Jhongli (TW); Ting-Hau Wu, Yilan (TW); Hsiang-Fu "Benior" Chen, Jhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 40 days.

(21) Appl. No.: 12/138,057

(22) Filed: Jun. 12, 2008

(65) Prior Publication Data
US 2009/0294766 A1    Dec. 3, 2009

Related U.S. Application Data

(60) Provisional application No. 61/058,114, filed on Jun. 2, 2008.

(51) Int. Cl.
*H01L 29/04* (2006.01)
(52) U.S. Cl. .......... 257/52; 257/E29.003; 257/415
(58) Field of Classification Search .......... 257/52, 257/E29.003, 415–420; 359/290, 291
See application file for complete search history.

(56) References Cited

U.S. PATENT DOCUMENTS

| | | | |
|---|---|---|---|
| 4,441,791 A * | 4/1984 | Hornbeck | 359/295 |
| 4,926,052 A * | 5/1990 | Hatayama et al. | 250/370.14 |
| 4,977,098 A * | 12/1990 | Yu et al. | 438/365 |
| 5,060,041 A * | 10/1991 | Haga et al. | 257/53 |
| 5,650,881 A | 7/1997 | Hornbeck | |
| 6,046,840 A | 4/2000 | Huibers | |
| 6,275,325 B1 | 8/2001 | Sinclair | |
| 6,300,156 B1 | 10/2001 | Decker et al. | |
| 6,329,738 B1 | 12/2001 | Hung et al. | |
| 6,337,760 B1 | 1/2002 | Huibers et al. | |
| 6,356,378 B1 | 3/2002 | Huibers | |
| 6,396,619 B1 | 5/2002 | Huibers et al. | |
| 6,408,878 B2 | 6/2002 | Unger et al. | |
| 6,529,310 B1 | 3/2003 | Huibers et al. | |
| 6,568,794 B2 | 5/2003 | Yamanaka et al. | |
| 6,804,039 B1 | 10/2004 | Doan et al. | |
| 6,885,494 B2 | 4/2005 | Patel et al. | |
| 6,929,969 B2 * | 8/2005 | Tzeng et al. | 438/52 |
| 7,167,298 B2 | 1/2007 | Pan | |
| 7,307,777 B2 | 12/2007 | Pan | |
| 2002/0196524 A1 | 12/2002 | Huibers et al. | |
| 2003/0134449 A1 | 7/2003 | Huibers | |
| 2004/0156089 A1 | 8/2004 | Doan et al. | |
| 2004/0226909 A1 | 11/2004 | Tzeng et al. | |

OTHER PUBLICATIONS

Chen, L. Y., et al., "Selective Chemical Vapor Deposition of Tungsten for Microdynamic Structures," Micro Electro Mechanical Systems, Proceedings of the IEEE, pp. 82-87 (1989), IEEE.
Horsley, D. A., et al., "Design and Fabrication of an Angular Microactuator for Magnetic Disk Drives," Journal of Microelectromechanical Systems, vol. 7, No. 2, pp. 141-148 (Jun. 1998), IEEE.
Van Kessel, P. F., et. al., "A MEMS-Based Projection Display," Proceedings of the IEEE, vol. 86, No. 8, pp. 1687-1704 (Aug. 1998), IEEE.

\* cited by examiner

*Primary Examiner* — Matthew W Such
*Assistant Examiner* — Monica D Harrison
(74) *Attorney, Agent, or Firm* — Slater & Matsil, L.L.P.

(57) ABSTRACT

A circuit structure includes a substrate; a first amorphous silicon layer over the substrate; a first glue layer over and adjoining the first amorphous silicon layer; and a second amorphous silicon layer over and adjoining the first glue layer.

19 Claims, 15 Drawing Sheets

PROCESS FOR ELIMINATING DELAMINATION BETWEEN AMORPHOUS SILICON LAYERS

This application claims the benefit of U.S. Provisional Application No. 61/058,114 filed on Jun. 2, 2008, entitled "Process for Eliminating Delamination between Amorphous Silicon Layers," which application is hereby incorporated herein by reference.

TECHNICAL FIELD

This invention relates generally to integrated circuits, and more particularly to methods for forming amorphous silicon layers and electrodes, and the resulting structures.

BACKGROUND

Spatial light modulators are widely used in commercial products such as video displays, televisions, and the like. In general, a spatial light modulator includes an array of cells, each of which includes a micro mirror that can be tilted about an axis and, furthermore, circuitry for generating electrostatic forces that operate to tilt the micro mirror. In addition, a spatial light modulator cell typically includes structures that hold and allow the tilting of the micro mirror. There are gaps between the cells for accommodating such structures. Each cell of a spatial light modulator usually further includes stoppers for mechanically stopping the cell's micro mirror at the "on" position and the "off" position, respectively.

In one implementation, for example, in a digital mode of operation for displaying video images, there are two positions at which the micro mirror can be tilted. In an "on" position or state, the micro mirror directs incident light to an assigned pixel of a display. In an "off" position or state, the micro mirror directs incident light away from the assigned pixel. The "on" position can be, for example, 20 degrees from the horizontal position, and the "off" position can be, for example, 15 degrees from the horizontal position.

Figure 1:
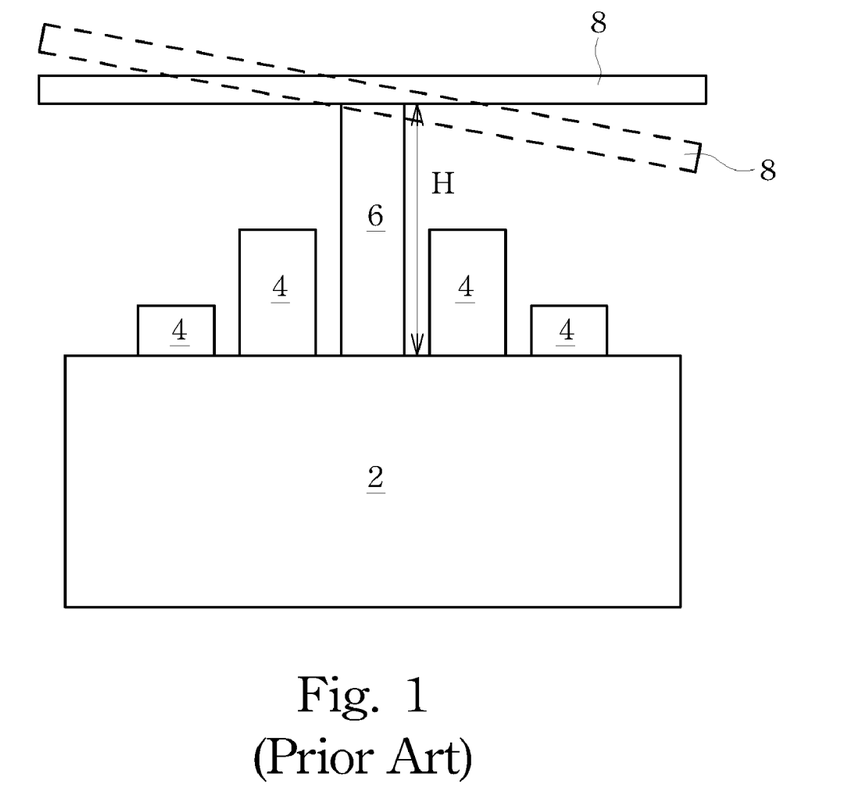
FIG. 1 illustrates a conventional spatial light modulator including a plurality of metal posts.

Spatial light modulators implemented as described above generally operate by tilting a selected combination of micro mirrors to selectively project light to display an image on the display. FIG. 1 schematically illustrates a spatial light modulator formed on substrate 2. The spatial light modulator includes metal post 6, and micro mirror 8 residing on metal post 6. Micro mirror 8 may be tilted (as shown using dashed lines) when voltages are applied on metal electrodes 4. Light thus may be reflected by micro mirror 8 to, or away from, the display (not shown).

The conventional spatial light modulator as shown in FIG. 1 suffers from drawbacks. First, the height H of metal post 6 is typically great according to the standards of integrated circuit formation processes, and the depositing and patterning of metal post 6 is relatively difficult. Second, due to the requirements that metal posts/electrodes 6 and 4 have different heights, various lithography processes are needed to precisely control the heights of the metal posts/electrodes 6 and 4, again causing an increase in the manufacturing cost. New methods for forming metal posts 6 are thus needed.

SUMMARY OF THE INVENTION

In accordance with one aspect of the present invention, a circuit structure includes a substrate; a first amorphous silicon layer over the substrate; a first glue layer over and adjoining the first amorphous silicon layer; and a second amorphous silicon layer over and adjoining the first glue layer.

In accordance with another aspect of the present invention, a circuit structure includes a substrate; an integrated circuit in the substrate; and a plurality of amorphous silicon posts over the substrate. The amorphous silicon posts are adjacent to, and separated from, each other. At least one amorphous silicon post of the plurality of amorphous silicon posts includes a first amorphous silicon layer; a glue layer over and adjoining the first amorphous silicon layer; and a second amorphous silicon layer over and adjoining the glue layer.

In accordance with yet another aspect of the present invention, a circuit structure includes a substrate and a plurality of amorphous silicon posts over the substrate. The amorphous silicon posts are adjacent to, and separated from, each other. At least one amorphous silicon post of the plurality of amorphous silicon posts includes a first amorphous silicon layer; a glue layer over and adjoining the first amorphous silicon layer; and a second amorphous silicon layer over and adjoining the glue layer. The circuit structure further includes a plurality of metal features in the substrate, wherein each metal feature of the plurality of metal features is electrically connected to one amorphous silicon post of the plurality of amorphous silicon posts; and an integrated circuit in the substrate and electrically connected to the plurality of metal features.

In accordance with yet another aspect of the present invention, a method of forming a circuit structure includes providing a substrate; forming a first amorphous silicon layer over the substrate; forming a first glue layer over and adjoining the first amorphous silicon layer; and forming a second amorphous silicon layer over and adjoining the first glue layer.

In accordance with yet another aspect of the present invention, a method of forming a circuit structure includes providing a substrate; forming a first amorphous silicon layer over the substrate; forming a first glue layer over and adjoining the first amorphous silicon layer; patterning the first glue layer without patterning the first amorphous silicon layer; forming a second amorphous silicon layer over and adjoining the first glue layer; forming a second glue layer over and adjoining the second amorphous silicon layer; patterning the second glue layer without patterning the second amorphous silicon layer; and performing an anisotropic etching to expose amorphous silicon in the first and the second amorphous silicon layers using remaining portions of the first and the second glue layers as etch stop layers, wherein a plurality of amorphous silicon posts is generated.

The advantageous features of the present invention include improved quality of amorphous silicon posts and reduced complexity in forming a plurality of amorphous silicon posts having different heights.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming micro posts and the resulting structures are provided. The intermediate stages of manufacturing a preferred embodiment of the present invention are illustrated. The variations and applications of the preferred embodiments are then discussed. Throughout the various views and illustrative embodiments of the present invention, like reference numbers are used to designate like elements.

Figure 2:
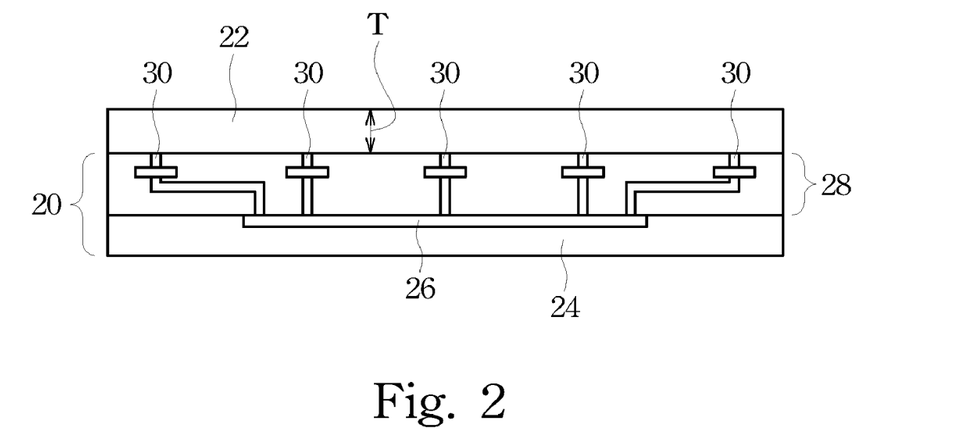
FIGS. 2 through 10 are cross-sectional views of intermediate stages in the manufacturing of an embodiment of the present invention.

Referring to FIG. 2, amorphous silicon layer 22 is formed on substrate 20. In an embodiment, substrate 20 includes semiconductor substrate 24, integrated circuit 26 formed at the top surface of semiconductor substrate 24, and interconnect structure 28 formed over integrated circuit 26 and semiconductor substrate 24. Integrated circuit 26 may include CMOS devices, such as NMOS and PMOS devices (not shown). Interconnect structure 28 may include metal lines and vias (refer to FIG. 11, which shows metal lines M1 through M5, and vias Via1 through Via5) formed in inter-metal dielectric layers. Metal features 30, which may be vias or metal pads, are formed at the top surface of substrate 20. Through metal features 30 and the underlying metal lines and vias, the subsequently formed amorphous posts 50 (refer to FIGS. 9 and 10) are electrically connected to integrated circuit 26. In alternative embodiments, substrate 20 may be a semiconductor or a dielectric substrate with no integrated circuit formed therein. For the sake of simplicity, in subsequent drawings, integrated circuit 26, interconnect structure 28, and metal features 30 are not shown.

Amorphous silicon layer 22 is formed on substrate 20 and is electrically connected to metal features 30. In an embodiment, amorphous silicon layer 22 is formed using the commonly used chemical vapor deposition (CVD) methods, such as plasma-enhanced CVD (PECVD). Preferably, when the deposition proceeds, amorphous silicon layer 22 is in-situ doped with a p-type or n-type impurity to increase its conductivity. Amorphous silicon layer 22 may also include other elements, such as germanium or the like. It was found that, if the thickness T of amorphous silicon layer 22 exceeds a certain value, its quality might be adversely degraded. For example, if the thickness T is greater than about 6.5 kÅ, the portions of amorphous silicon layer 22 close to the wafer edges may delaminate. Therefore, the thickness T of amorphous silicon layer 22 is preferably less than about 6.5 kÅ, and more preferably less than about 6 kÅ, and even more preferably between about 2.5 kÅ and about 3.5 kÅ. One skilled in the art will realize, however, that the dimensions recited throughout the description are merely examples, and will change if different formation technologies are used. The temperature for forming amorphous silicon layer 22 may be, for example, between about 350° C. and about 400° C.

Since the thickness T of amorphous silicon layer 22 is limited, to achieve a greater thickness T, more than one amorphous silicon layer is stacked to solve the quality degradation problem. Between the formation steps of the amorphous silicon layers, the formation process is stopped, and the respective wafer comprising substrate 20 may be moved out of the deposition chamber.

Figure 3:
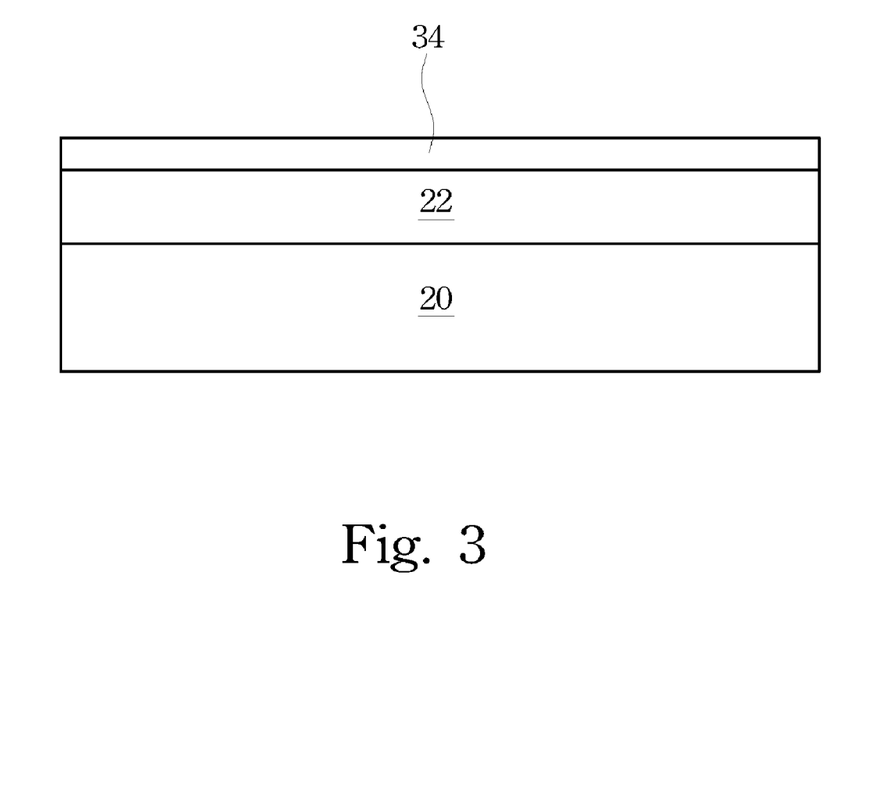

However, the stacking of amorphous silicon layers causes another problem. Experiments performed by the inventors of the present application have revealed that air bubbles may be formed between the amorphous silicon layers. To solve this problem, in the embodiments of the present invention, glue layers are formed between amorphous silicon layers. Referring to FIG. 3, glue layer 34 is formed on amorphous silicon layer 22. In an embodiment, glue layer 34 is formed of titanium, titanium nitride, tantalum, tantalum nitride, compounds thereof, multi-layers thereof, or the like. In other embodiments, any other materials that can glue two amorphous silicon layers without causing bubbles and are at least semi-conductive may be used. Glue layer 34 may have a thickness of between about 0.5 kÅ and about 2.0 kÅ. The formation method of glue layer 34 is physical vapor deposition (PVD).

Figure 4:
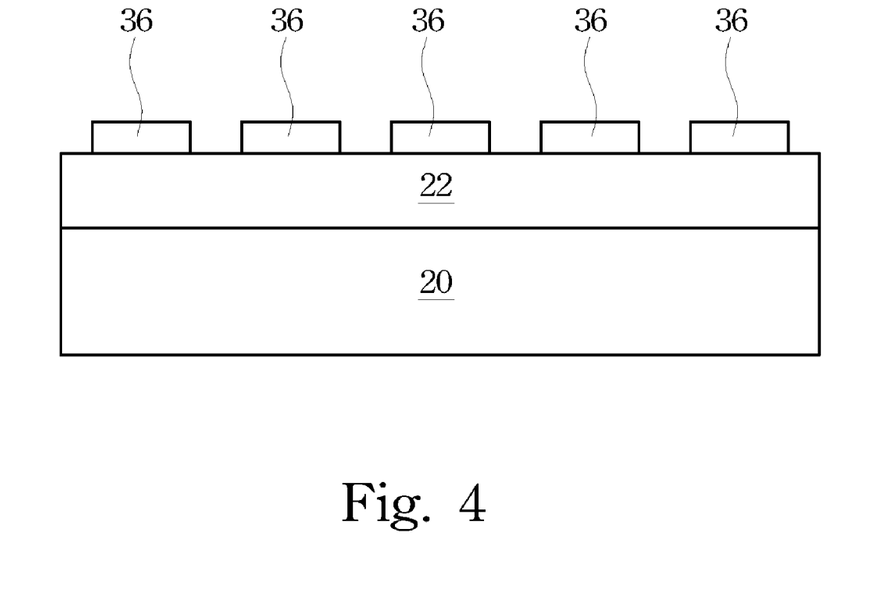
Figure 5:
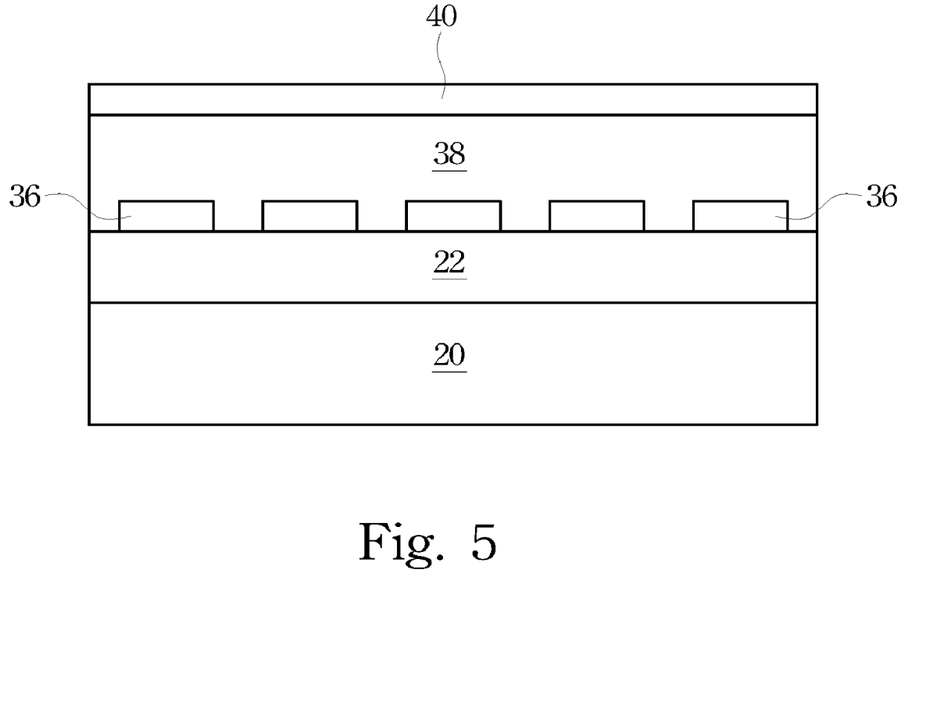

FIG. 4 illustrates the patterning of glue layer 34 to form glue layer patterns 36, which may be performed, for example, by dry etching. Glue layer patterns 36 are separated from each other. The locations and dimensions of glue layer patterns 36 are determined by the requirements of the respective applications. Next, as shown in FIG. 5, amorphous silicon layer 38 is formed, followed by the formation of glue layer 40. The formation processes and the dimensions of amorphous silicon layer 38 and glue layer 40 may be essentially the same as the formation of amorphous silicon layer 22 and glue layer 34 (refer to FIG. 3), respectively. Glue layer 40 may be formed of a same material, or of a different material selected from a same group of the above-discussed materials, as glue layer 34. Alternatively, glue layer 40 is formed of a different material than glue layer 34.

Figure 6:
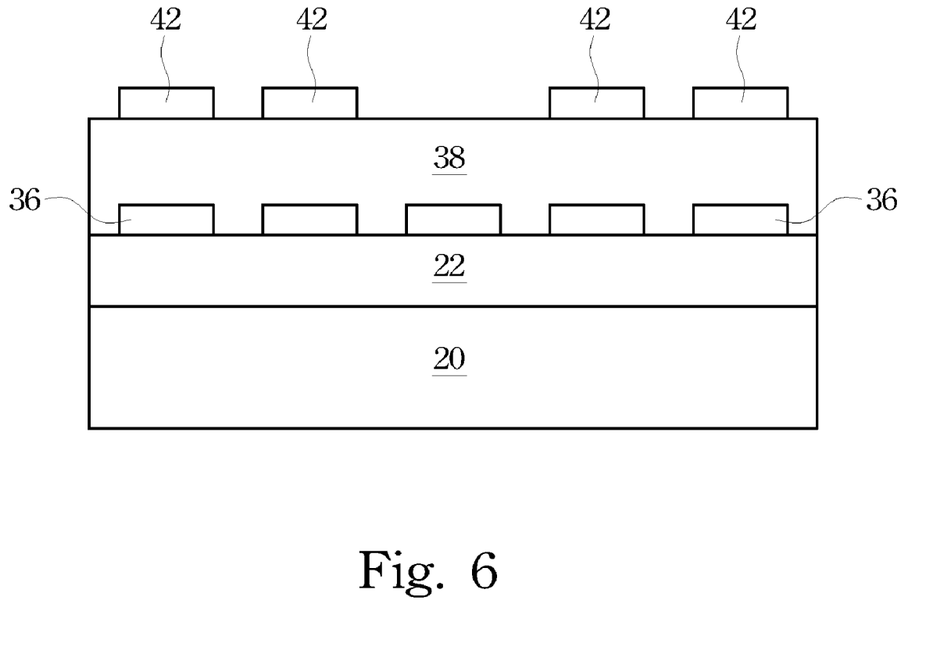

Referring to FIG. 6, glue layer 40 is patterned, forming glue layer patterns 42. The patterns of glue layer patterns 42 may be the same as, or different from, the patterns of glue layer patterns 36. In the illustrated example, glue layer patterns 42 lack a central pattern vertically aligned to the central pattern in glue layer patterns 36.

Figure 7:
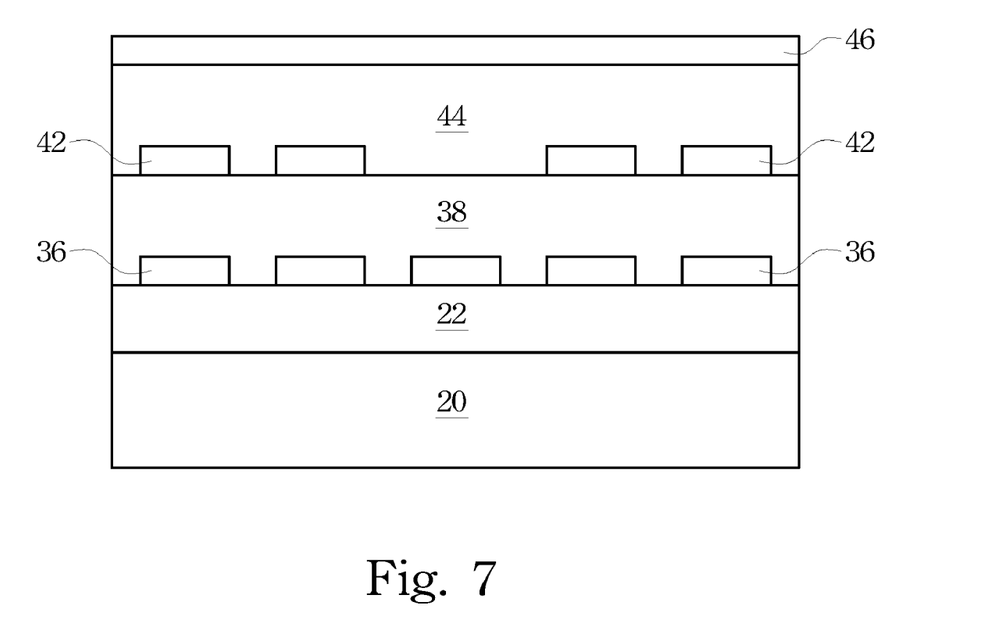
Figure 8:
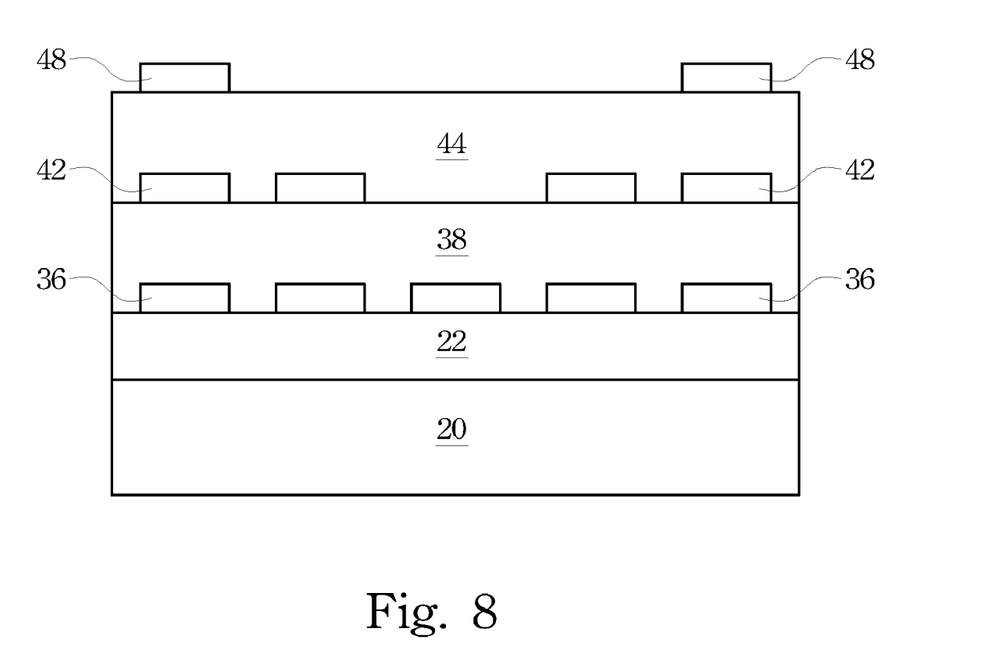

FIGS. 7 and 8 illustrate the formation of amorphous silicon layer 44 and glue layer patterns 48. In FIG. 7, amorphous silicon layer 44 is formed, for example, using essentially the same method as the formation of amorphous silicon layers 22 and 38. Glue layer 46 is also formed using essentially the same method, and has similar dimensions and materials, as glue layers 34 and 40 (refer to FIGS. 3 and 5). In FIG. 8, glue layer 46 is patterned to form glue layer patterns 48, which may be the same as, or different from, the patterns of the underlying glue layer patterns 36 and 42. Although not shown, more amorphous silicon layers may be stacked on the structure shown in FIG. 8, with glue layers (patterns) formed between the amorphous silicon layers. The desirable number of amorphous silicon layers is determined by the required height of the amorphous silicon posts, as will be discussed in the subsequent paragraphs.

Figure 9:
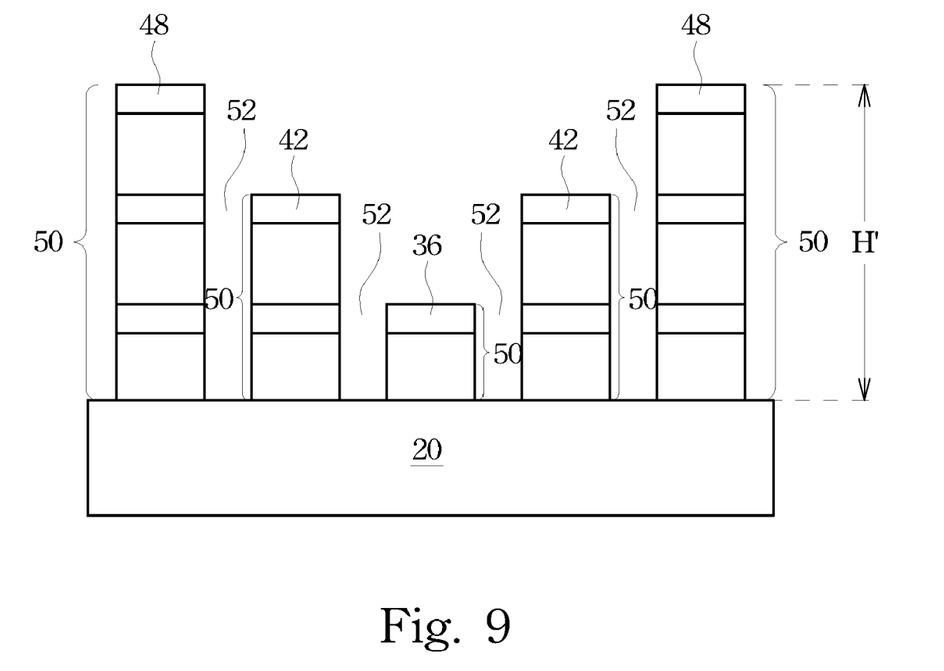

Referring to FIG. 9, the structure as shown in FIG. 8 is etched anisotropically, for example, by dry etching, to remove the portions of amorphous silicon un-protected by glue layer patterns 36, 42, and 48. The portions of amorphous silicon underlying glue layer patterns 36, 42, and 48 are not etched, with glue layer patterns 36, 42, and 48 acting as etch stop layers. In the resulting structure, a plurality of amorphous silicon posts 50 is formed. In an embodiment, the resulting silicon posts 50 all have a same height, which may be formed by making glue layer patterns 36, 42, and 48 identical to each other. In other embodiments, amorphous silicon posts 50 have different heights. The spacings 52 between amorphous silicon posts 50 may be left as air isolations or filled with a dielectric material. The top glue layer on the top of each of the amorphous silicon posts 50 may be left un-removed in the final structure, as shown in FIG. 9, or may be removed, as shown in FIG. 10.

Figure 10:
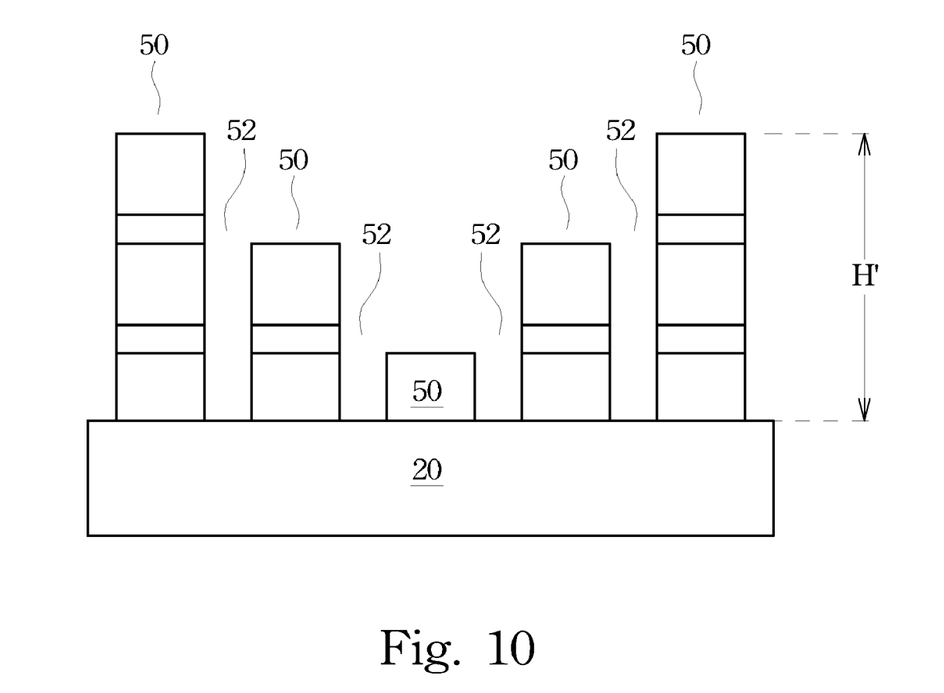

In the resulting structure as shown in FIG. 9 or FIG. 10, the highest amorphous silicon posts 50 may have a height H' greater than about 6.5 kÅ, and may even be greater than about 10 kÅ. Depending on the application, the number, the dimensions, and the locations of amorphous silicon posts 50 may vary from one application to the next. In an exemplary embodiment, the number of amorphous silicon posts 50 may be greater than about 5. The desirable number of amorphous silicon posts 50 is determined by the preferred height of the highest amorphous silicon posts 50, wherein each of the amorphous silicon layers in the amorphous silicon posts 50 preferably has a thickness of less than about 6.5 kÅ. However, to reduce the manufacturing cost, the thickness of each of the amorphous silicon layers in amorphous silicon posts 50 is preferably not smaller than, and is preferably greater than, about 3.5 kÅ.

In an embodiment, each of (or at least some of) the amorphous silicon posts 50 is electrically connected to one of underlying metal features 30 (refer to FIG. 2). Accordingly, each of the amorphous silicon posts 50 may be individually applied with a voltage different from, or the same as, a voltage applied on other amorphous silicon posts 50.

Figure 11:
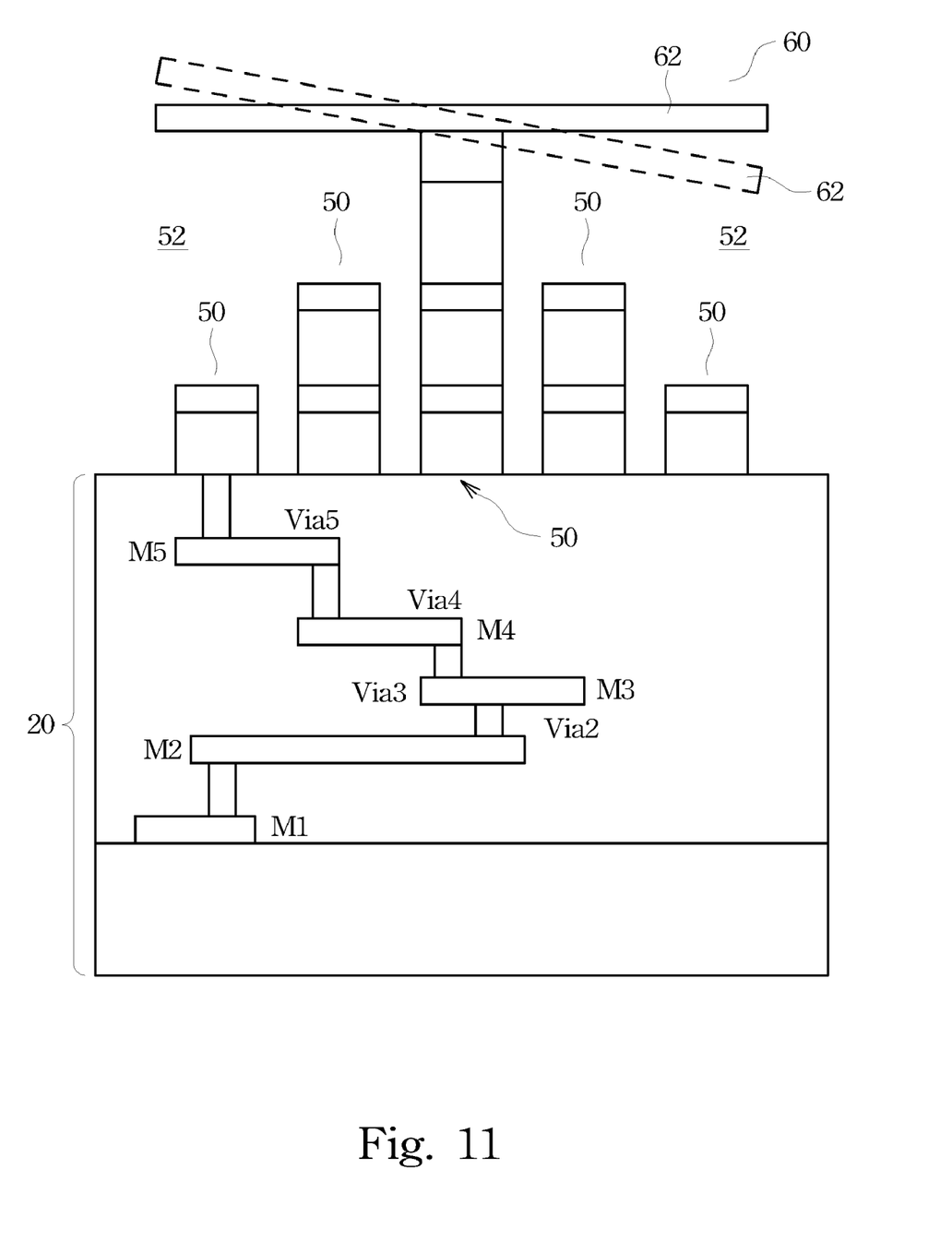
FIG. 11 illustrates a spatial light modulator having amorphous silicon posts.

FIGS. 11 through 15B illustrate application embodiments of the present invention. FIG. 11 illustrates a micro mirror cell 60 including micro mirror 62, which may be formed of metal, over amorphous silicon posts 50. In this embodiment, the highest (central) amorphous silicon post 50 is placed in the center of micro mirror cell 60, with amorphous silicon posts 50 on both sides of the central amorphous silicon post 50 having smaller heights. The micro mirror 62 may be tilted by applying appropriate voltages on amorphous silicon posts 50. For example, if a positive voltage is applied on the central amorphous silicon post 50, to make micro mirror 62 tilt to the right side, a negative voltage may be applied on the amorphous silicon posts 50 on the right side of the central amorphous silicon post 50. Alternatively, a positive voltage may be applied on the amorphous silicon posts 50 on the left side of the central amorphous silicon post 50. In this case, air isolations 52 are left to allow space for micro mirror 62 to tilt. In an exemplary embodiment, the height of the central amorphous silicon post 50 is greater than about 15 kÅ.

Figure 12A:
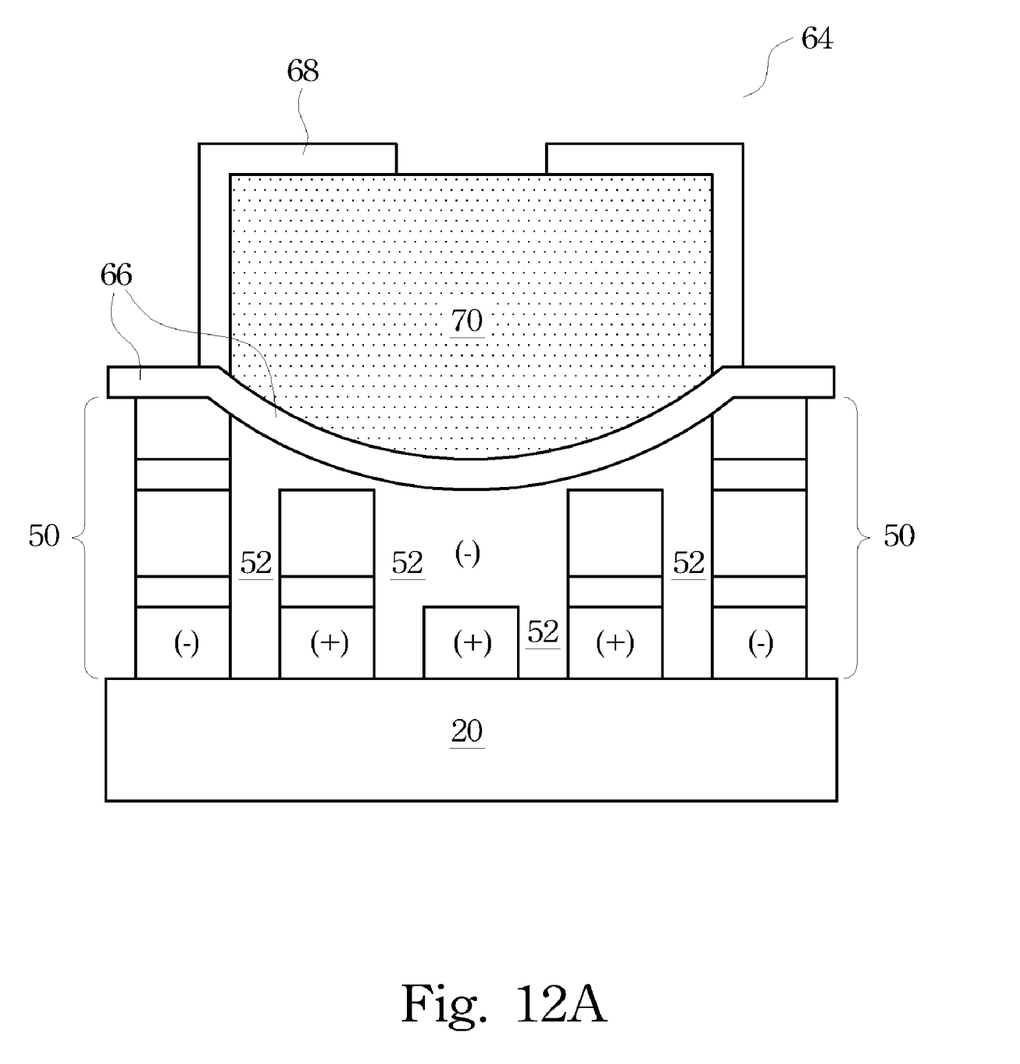
FIGS. 12A and 12B illustrate an inkjet head including amorphous silicon posts.
Figure 12B:
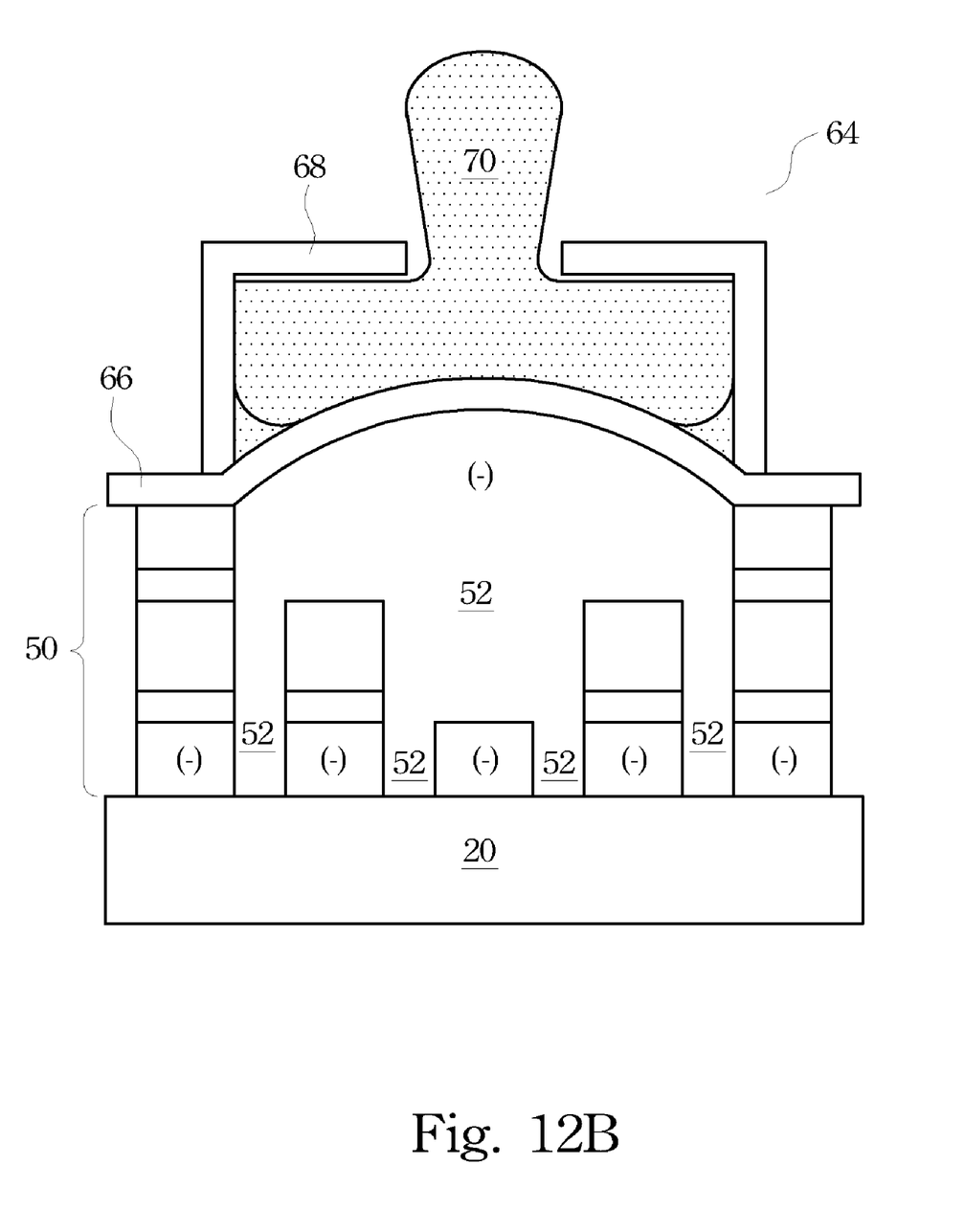

FIGS. 12A and 12B illustrate inkjet head 64, which is used for emitting ink. The ink may be stored in storage 68. Inkjet head 64 includes a plurality of amorphous silicon posts 50, with the central amorphous silicon post 50 being lower than surrounding ones. Conductive membrane 66 is attached to the edge ones of the amorphous silicon posts 50. If the amorphous silicon posts 50 directly underlying membrane 66 are applied with a different voltage than membrane 66, membrane 66 is attracted downward, allowing ink 70 to be stored in inkjet head 64, as is shown in FIG. 12A. When the voltages on the amorphous silicon posts 50 directly underlying membrane 66 are reversed, membrane 66 is pushed up, and hence ink 70 is emitted, as shown in FIG. 12B. In this case, spaces 52 are preferably air isolations.

Figure 13A:
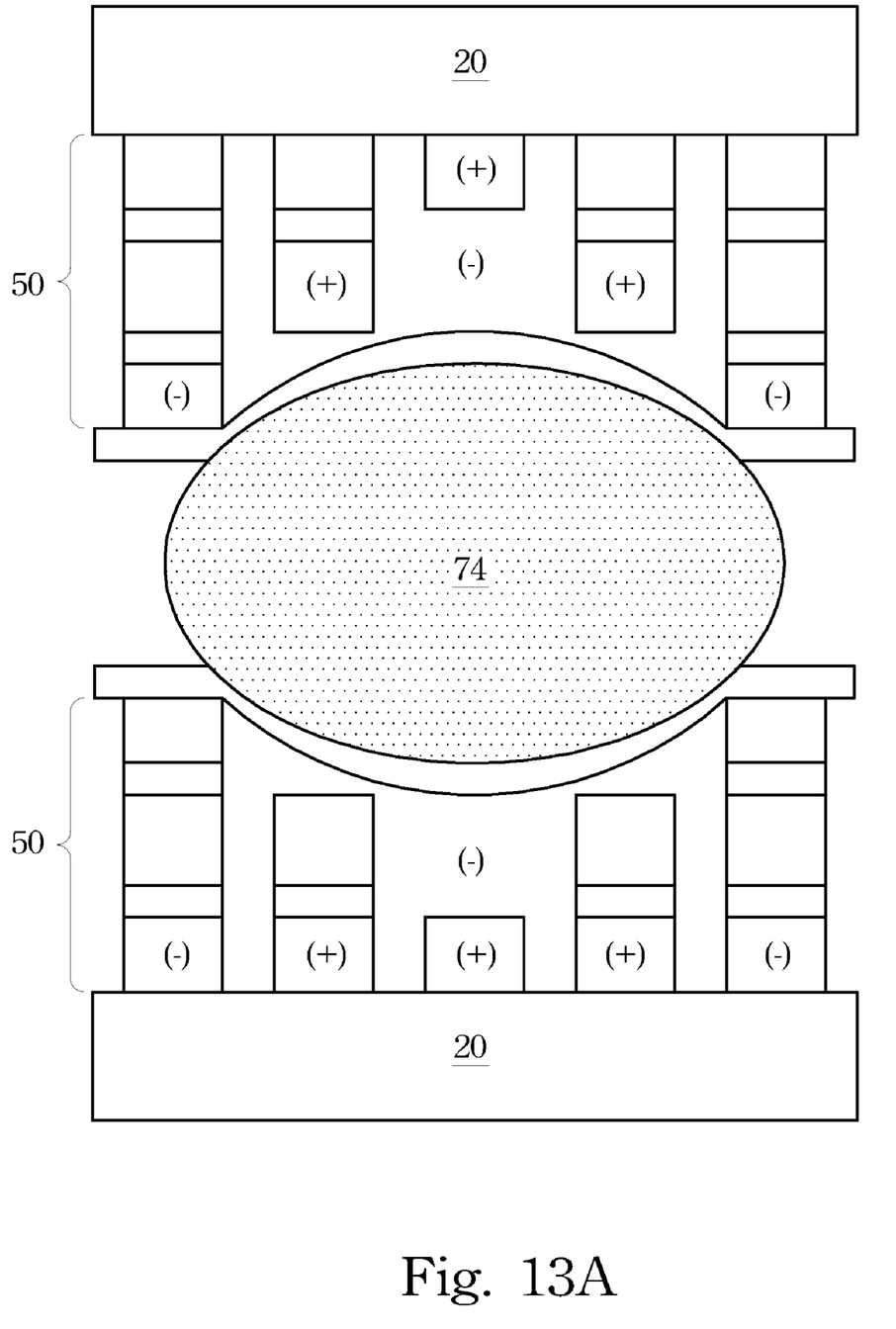
FIGS. 13A and 13B illustrate a micro flow pump including amorphous silicon posts.
Figure 13B:
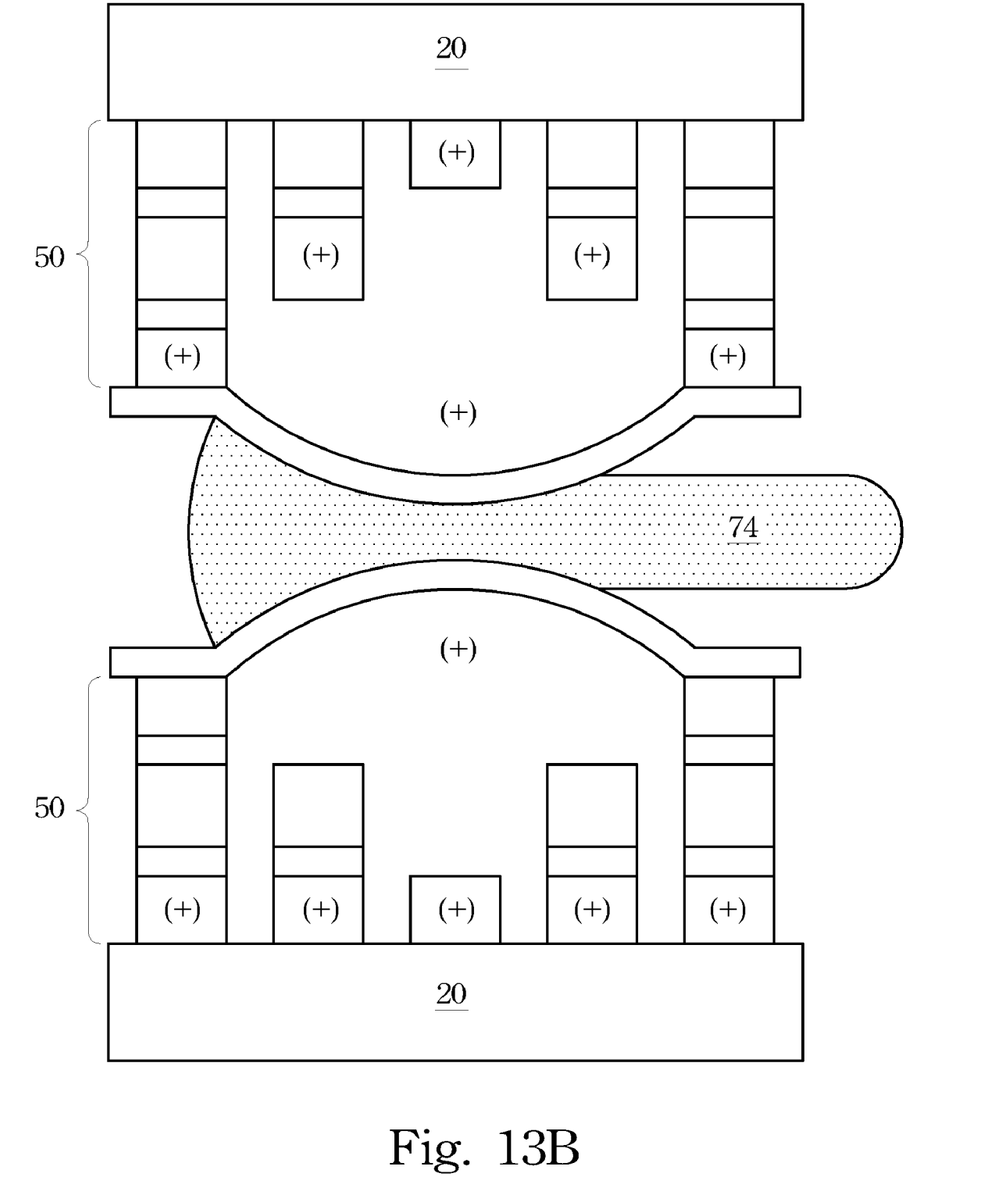

FIGS. 13A and 13B illustrate yet another application, in which amorphous silicon posts 50 are used in a micro flow pump, which may be used in a bio micro electronic mechanic system (MEMS). The embodiment shown in FIGS. 13A and 13B is used to emit fluid 74. The work mechanism is similar to the embodiment shown in FIGS. 12A and 12B.

Figure 14A:
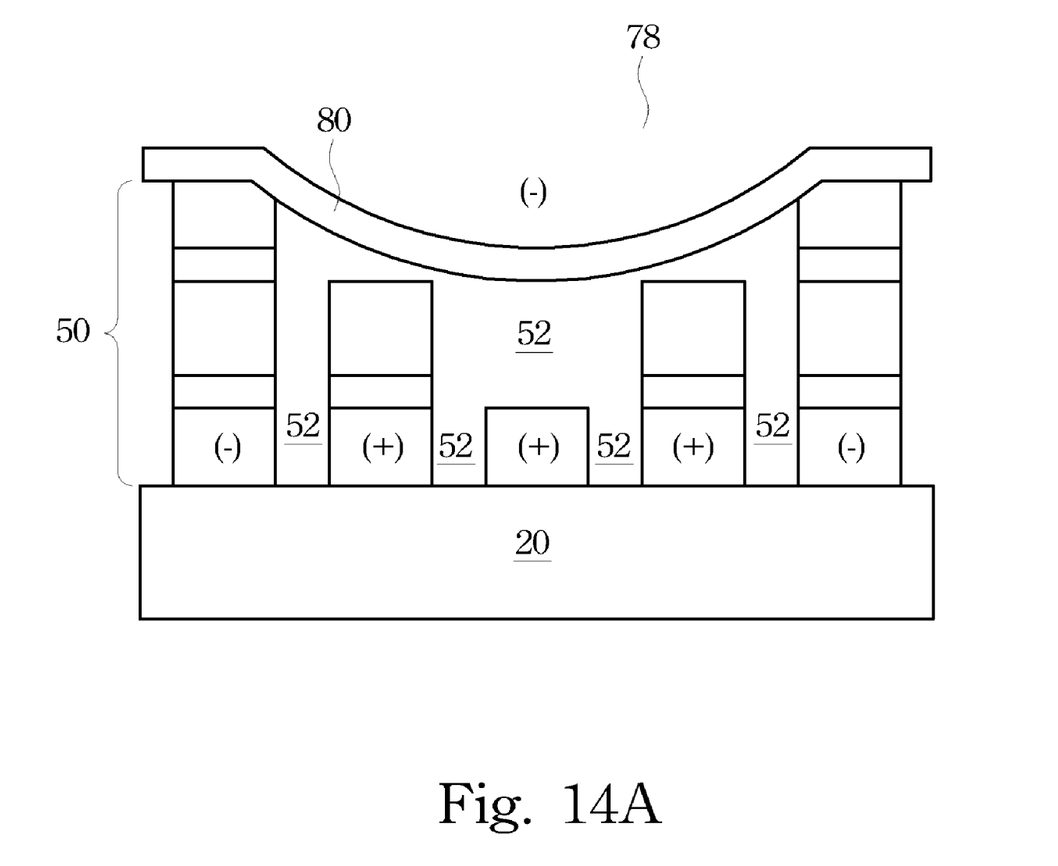
FIGS. 14A and 14B illustrate a speaker including amorphous silicon posts.
Figure 14B:
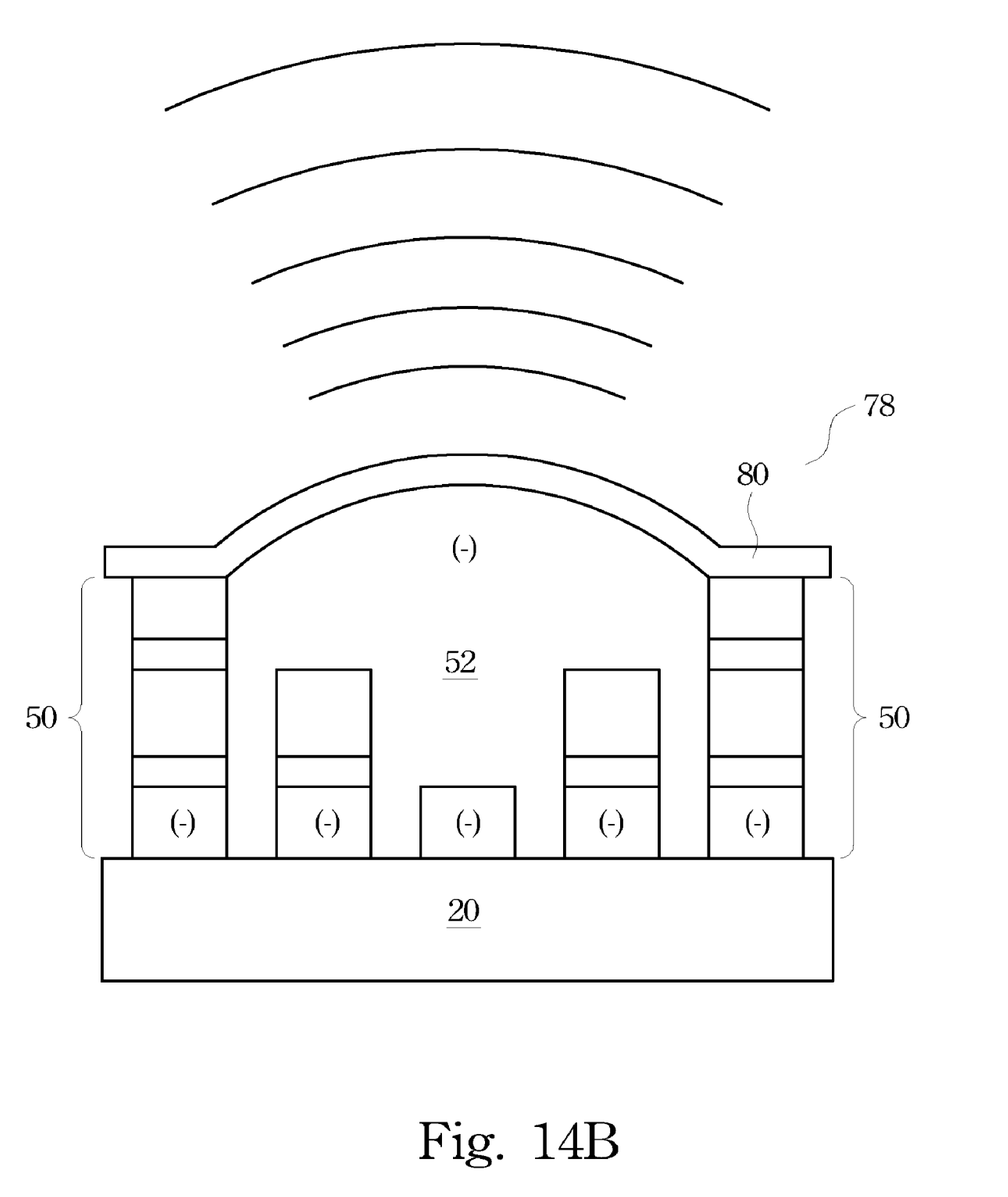

FIGS. 14A and 14B illustrate speaker 78, which includes amorphous silicon posts 50, and conductive membrane 80 attached to edge ones of the amorphous silicon posts 50. It is realized that by alternating the voltages applied on the amorphous silicon posts 50 directly underlying membrane 80, membrane 80 may move up and down rapidly, causing the vibration of air, and hence sound is generated. Again, spaces 52 are air isolations.

Figure 15A:
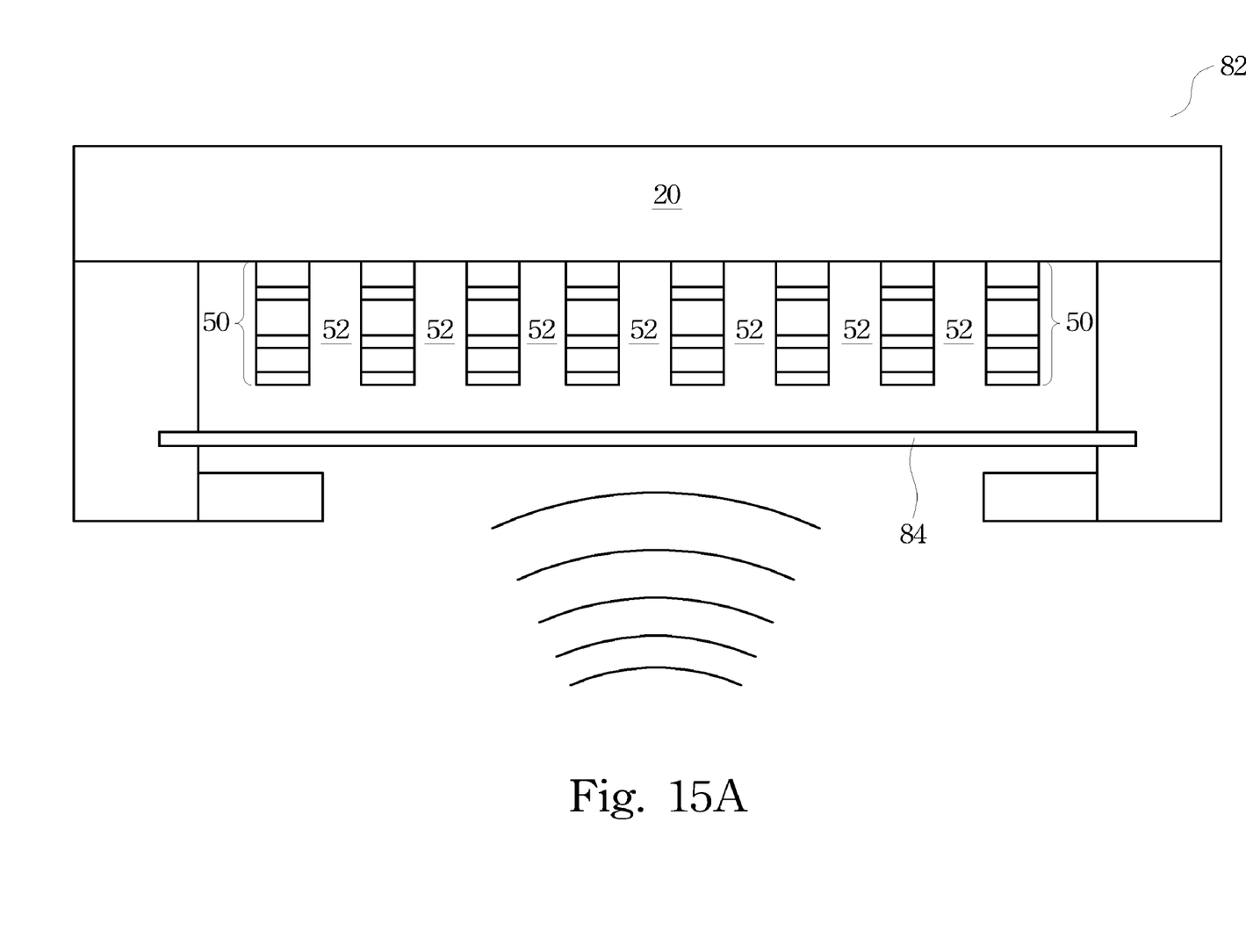
FIGS. 15A and 15B illustrate a microphone including amorphous silicon posts.
Figure 15B:
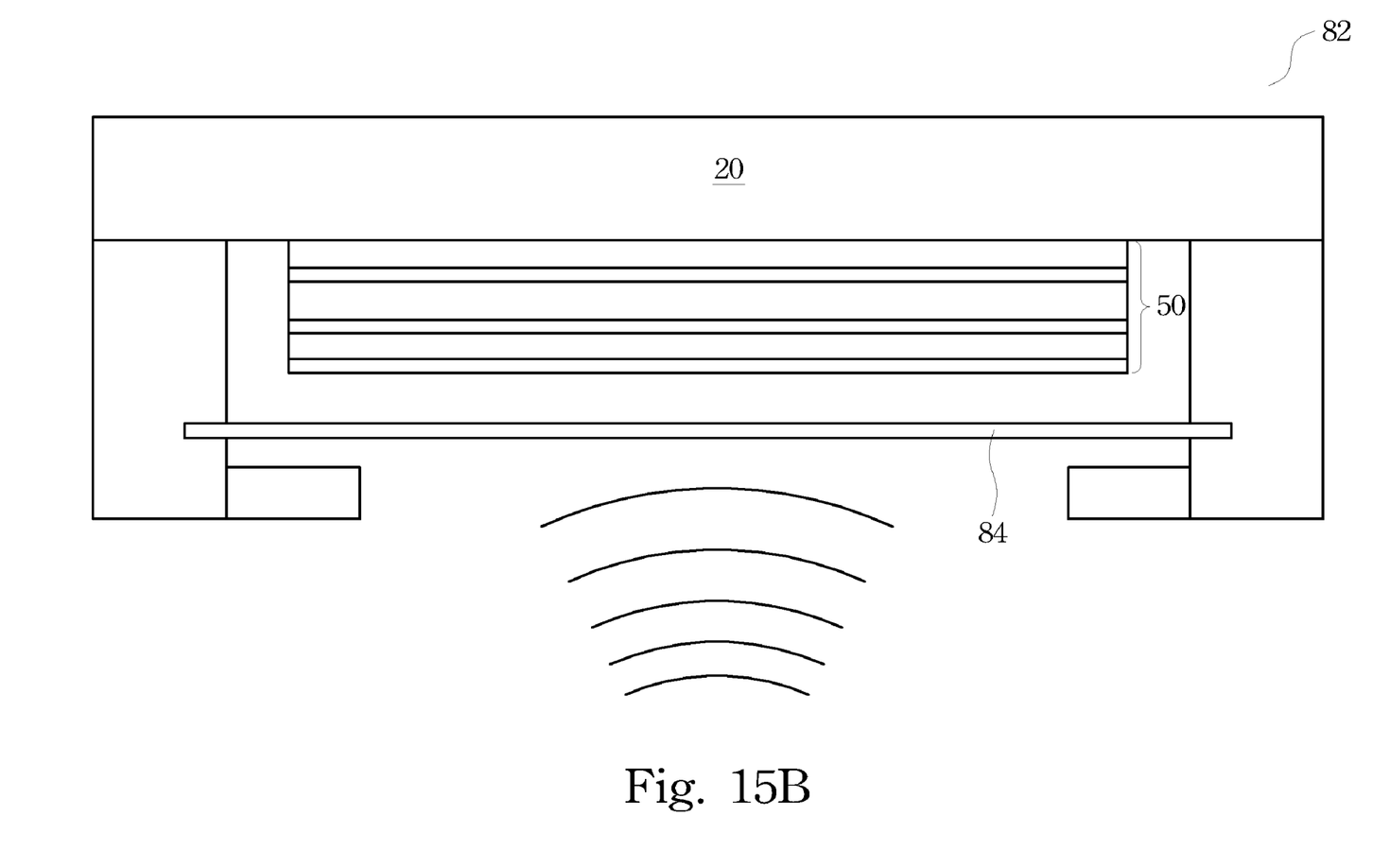

FIGS. 15A and 15B illustrate microphone 82, which again includes amorphous silicon posts 50 and conductive membrane 84. Amorphous silicon posts 50 may be electrically interconnected, thereby forming a capacitor with conductive membrane 84. When sound (in the form of air vibration) is received by conductive membrane 84, conductive membrane 84 vibrates, and the distance between conductive membrane 84 and amorphous silicon posts 50 changes, causing the change of the capacitance of the respective capacitor. The sound is thus converted into electrical signals. In this application, amorphous silicon posts 50 may be separated from each other by air isolations 52, as shown in FIG. 15A. Alternatively, spacings 52 may be filled with a dielectric material. In other embodiments, no patterning is performed to separate the glue layers and amorphous silicon layers into posts, and the resulting structure is shown in FIG. 15B.

Figure 16A:
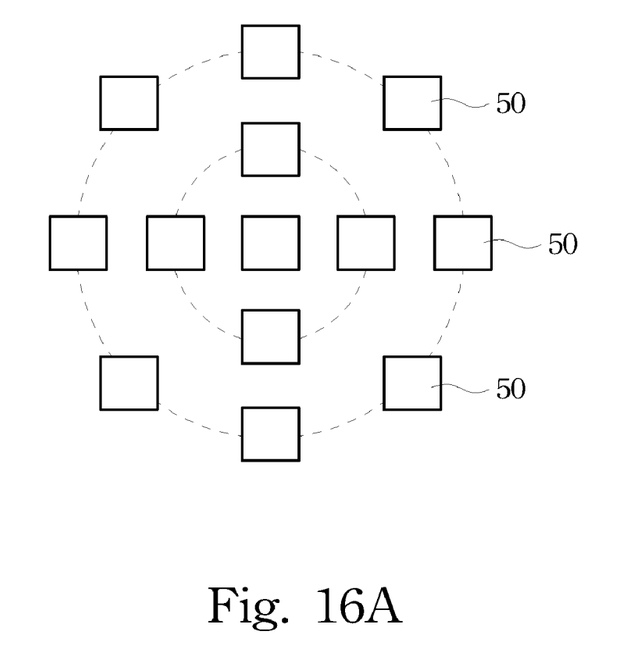
FIGS. 16A and 16B illustrate top views of the amorphous silicon posts shown in FIGS. 11 through 15B.
Figure 16B:
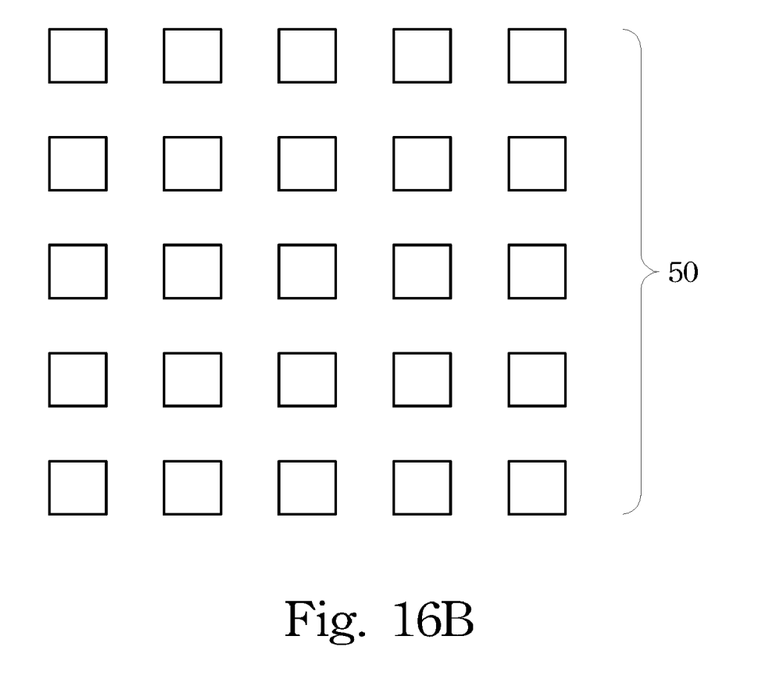

In each of the embodiments shown in FIGS. 11 through 15B, from the center going outward, the amorphous silicon posts 50 may form circles surrounding the central amorphous silicon posts 50, or they may form square/rectangle patterns, as shown in the top views of FIGS. 16A and 16B, respectively.

The embodiments of the present invention have several advantageous features. The posts are formed of amorphous silicon, and hence the patterning of the resulting posts is relatively easy, even if the posts may have great heights. By forming glue layers between amorphous silicon layers, the heights of the amorphous silicon posts may be increased without causing defects.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit structure comprising:
   a substrate;
   a first amorphous silicon layer over the substrate;
   a first glue layer over and adj dining the first amorphous silicon layer;
   a second amorphous silicon layer over and adjoining the first glue layer;

a second glue layer over and adjoining the second amorphous silicon layer;
a third amorphous silicon layer over and adjoining the second glue layer; and
a third glue layer over and adjoining the third amorphous silicon layer, wherein the first glue layer, the second glue layer, and the third glue layer do not directly physically contact each other.

2. The circuit structure of claim 1 further comprising:
a conductive feature underlying and electrically connected to the first amorphous silicon layer; and
an integrated circuit in the substrate and electrically connected to the conductive feature.

3. The circuit structure of claim 1, wherein each of the first and the second amorphous silicon layers has a thickness of less than about 6.5 kÅ.

4. The circuit structure of claim 1 further comprising a plurality of amorphous silicon posts, the amorphous silicon posts adjacent to, and separated from, each other, wherein one of the amorphous silicon posts comprises the first and the second amorphous silicon layers and the first glue layer.

5. The circuit structure of claim 4, wherein the amorphous silicon posts are separated from each other by air isolations, and wherein the circuit structure further comprises a feature directly above at least portions of the air isolations.

6. The circuit structure of claim 5 further comprising a conductive membrane over and adjacent the amorphous silicon posts, wherein the conductive membrane is separated from at least one of the amorphous silicon posts by an additional air isolation.

7. The circuit structure of claim 1, wherein the first glue layer comprises a material selected from the group consisting essentially of titanium, titanium nitride, tantalum, tantalum nitride, and combinations thereof.

8. A circuit structure comprising:
a substrate;
an integrated circuit in the substrate; and
a plurality of amorphous silicon posts over the substrate, wherein the amorphous silicon posts are adjacent to each other and separated from each other by air isolations, and wherein at least one of the amorphous silicon posts comprises:
a first amorphous silicon layer;
a glue layer over and adjoining the first amorphous silicon layer; and
a second amorphous silicon layer over and adjoining the glue layer.

9. The circuit structure of claim 8 further comprising a plurality of metal features in the substrate, wherein each of the metal features is electrically connected to one of the amorphous silicon posts.

10. The circuit structure of claim 8, wherein the circuit structure further comprises a feature over the amorphous silicon posts.

11. The circuit structure of claim 8, wherein each of the amorphous silicon posts is capped by an additional glue layer.

12. The circuit structure of claim 8, wherein each of the amorphous silicon posts is capped by amorphous silicon.

13. The circuit structure of claim 8, wherein at least one of the amorphous silicon posts has a different height and a different number of amorphous silicon layers than other ones of the amorphous silicon posts.

14. A circuit structure comprising:
a substrate;
a plurality of amorphous silicon posts over the substrate, wherein the amorphous silicon posts are adjacent to, and separated from, each other, and wherein at least one of the amorphous silicon posts comprises:
a first amorphous silicon layer;
a glue layer over and adjoining the first amorphous silicon layer; and
a second amorphous silicon layer over and adjoining the glue layer, wherein the first amorphous silicon layer does not directly physically contact the second amorphous silicon layer;
a plurality of metal features in the substrate, wherein each of the metal features is electrically connected to one of the amorphous silicon posts; and
an integrated circuit in the substrate and electrically connected to the metal features.

15. The circuit structure of claim 14, wherein a central amorphous silicon post in the plurality of amorphous silicon posts has a greater number of amorphous silicon layers than surrounding ones of the plurality of amorphous silicon posts.

16. The circuit structure of claim 15 further comprising a micro mirror on, and electrically connected to, the central amorphous silicon post.

17. The circuit structure of claim 14, wherein a central amorphous silicon post in the plurality of amorphous silicon posts has a smaller number of amorphous silicon layers than surrounding ones of the plurality of amorphous silicon posts.

18. The circuit structure of claim 17 further comprising a conductive membrane electrically insulated from the central amorphous silicon post by an air insulation, wherein the conductive membrane is attached to the surrounding ones of the plurality of amorphous silicon posts.

19. The circuit structure of claim 18, wherein the conductive membrane is electrically connected to at least one of the surrounding ones of the plurality of amorphous silicon posts.

* * * * *